United States Patent [19]
Arita et al.

[11] Patent Number: 5,980,276
[45] Date of Patent: Nov. 9, 1999

[54] ELECTRONIC APPARATUS WITH A CARD INTERFACE

[75] Inventors: Naoki Arita; Shin Kawabe, both of Tokyo, Japan

[73] Assignee: Mitsubishi Denki Kabushiki Kaisha, Tokyo, Japan

[21] Appl. No.: 09/053,665

[22] Filed: Apr. 2, 1998

[30] Foreign Application Priority Data

Sep. 19, 1997 [JP] Japan .................................. 9-255615

[51] Int. Cl.⁶ .................................................. H01R 13/20
[52] U.S. Cl. ........................................... 439/131; 361/741
[58] Field of Search ...................... 439/64, 131

[56] References Cited

U.S. PATENT DOCUMENTS 5,745,345  4/1998  Deguchi ................................. 439/131

FOREIGN PATENT DOCUMENTS

| 4-38685 | 3/1992 | Japan . |
| 5-23276 | 3/1993 | Japan . |
| 5-62066 | 8/1993 | Japan . |
| 6-48045 | 6/1994 | Japan . |

OTHER PUBLICATIONS

Patent Abstracts of Japan, Japanese Patent Document No. 4–154198, May 1992.
Patent Abstracts of Japan, Japanese Patent Document No. 5–225771, Sep. 1993.
Patent Abstracts of Japan, Japanese Patent Document No. 6–102967, Apr. 1994.
Patent Abstracts of Japan, Japanese Patent Document No. 6–139415, May 1994.
Patent Abstracts of Japan, Japanese Patent Document No. 8–096896, Apr. 1996.
Patent Abstracts of Japan, Japanese Patent Document No. 8–180144, Jul. 1996.

*Primary Examiner*—Neil Abrams
*Assistant Examiner*—J. F. Duverne
*Attorney, Agent, or Firm*—Burns, Doane, Swecker, Mathis, LLP

[57] ABSTRACT

A small and thin electronic apparatus (1) is provided by setting a PC card (2) outside the small electronic apparatus (1). The small electronic apparatus (1) includes a movable PC card connector (3) for connecting to the PC card (2) outside the small electronic apparatus (1). The small electronic apparatus (1) also includes a leg (9). Since the PC card (2) can be set outside the small electronic apparatus (1), a space for setting the PC card (2) is not necessary inside the small electronic apparatus (1). Consequently, down-sizing and reduction of thickness of the electronic apparatus (1) can be realized. Since the PC card (2) can be set outside, the PC card (2) can be used even for a small electronic apparatus (1) having A6 size, which generally does not have a space for setting the PC card (2) inside.

20 Claims, 10 Drawing Sheets

ELECTRONIC APPARATUS WITH A CARD INTERFACE

BACKGROUND OF THE INVENTION

1. Field of the Invention

This invention relates to an electronic apparatus, in which a card, more particularly a PC (Personal Computer) card, can be set.

2. Description of the Related Art

Recently, most small electronic apparatuses, e.g., portable personal computers, portable terminals, etc. have various high-quality functions. Such small electronic apparatuses generally have expansion slots for PC cards.

The PC cards are standardized by PCMCIA (Personal Computer Memory Card International Association) in America and JEIDA (Japan Electronic Industry Development Association) in Japan.

Among the PC cards, there are a memory card, e.g., a SRAM (Static Random Access Memory) card, ROM (Read Only Memory) card, Flash Memory card, etc., an ATA (AT attachment) card for functioning as a hard disk with an IDE (Integrated Drive Electronics) interface, a FAX (facsimile) card for communicating via telephone lines, a LAN (Local Area Network) card for connecting PCs via LAN, a SCSI (Small Computer System Interface) card for connecting to a SCSI apparatus, a sound card for playing music or producing sound effects by a PC, an ISDN (Integrated Services Digital Network) card for connecting to ISDN lines, and a Video Capture card for capturing a video signal.

Figure 18:
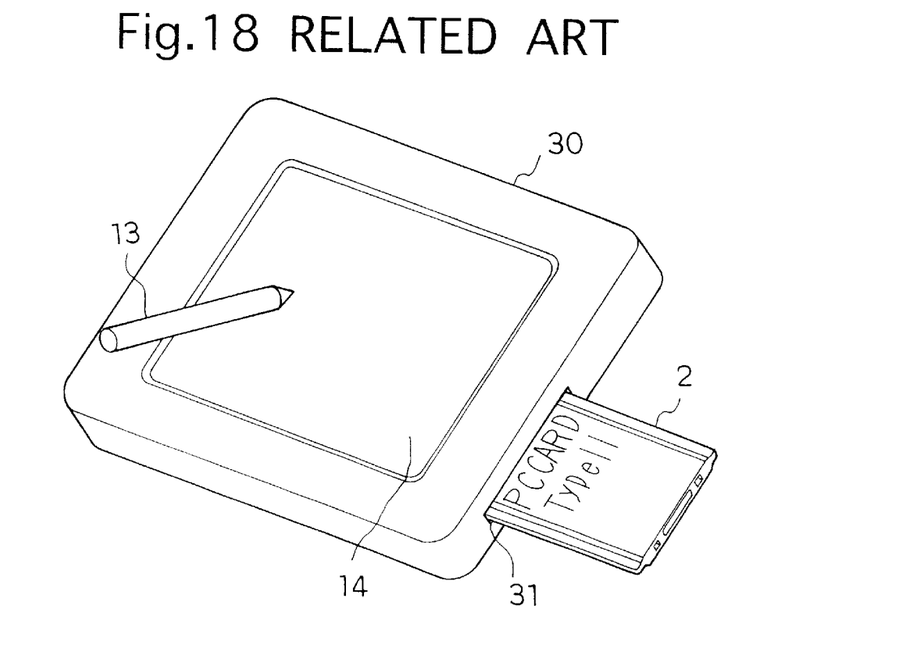
FIG. 18 illustrates a perspective view of an electronic apparatus according to the related art for explaining a configuration for setting a PC card.
Figure 19:
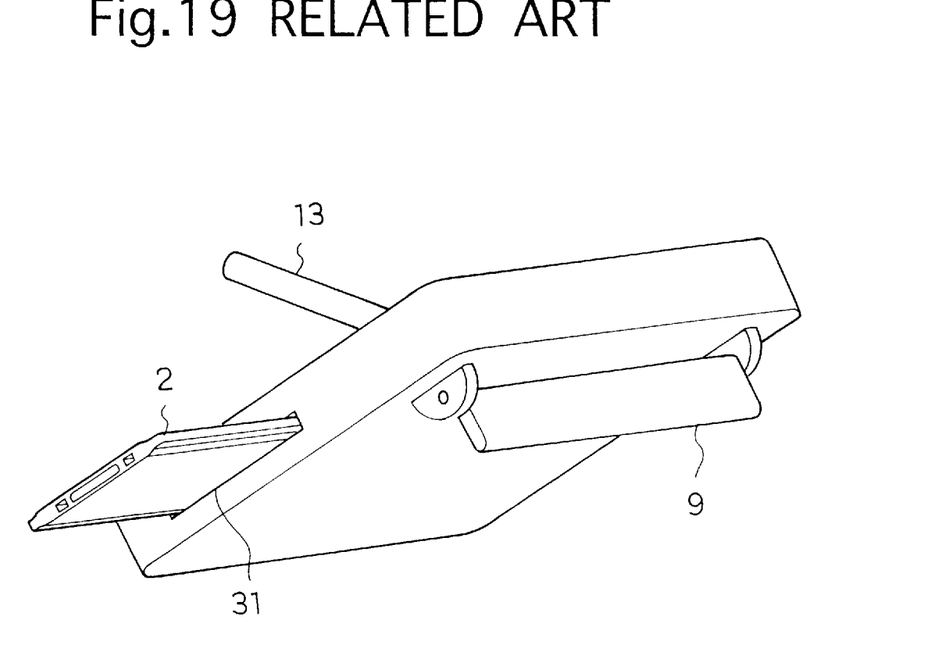
FIG. 19 illustrates a bottom perspective view of the electronic apparatus according to the related art for explaining a configuration for setting the PC card.
Figure 20:
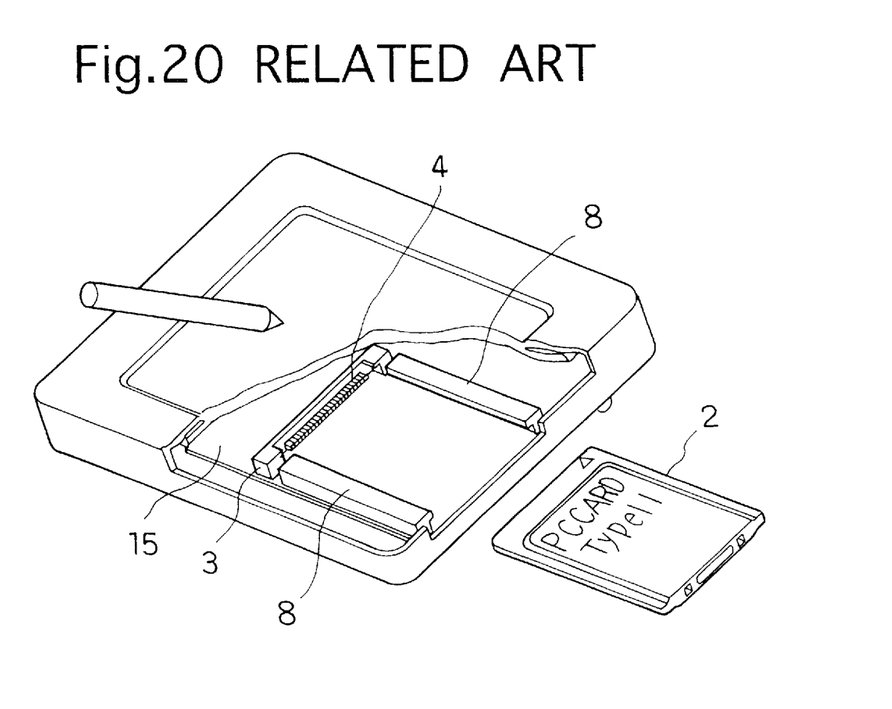
FIG. 20 illustrates a "broken" view of the electronic apparatus according to the related art for explaining a configuration for setting the PC card.

FIG. 18 illustrates a perspective view of a small electronic apparatus in which a PC card is set in a configuration according to the related art. The small electronic apparatus includes an input device comprising a pen. FIG. 19 illustrates a bottom perspective view of the small electronic apparatus according to the related art for explaining a bottom of the small electronic apparatus. FIG. 20 illustrates a partially "broken" view (e.g., with a portion of the frame removed) of the small electronic apparatus according to the related art for explaining an internal configuration of the small electronic apparatus.

FIG. 18 illustrates a small electronic apparatus 30 in which a PC card is set in a configuration according to the related art. In the small electronic apparatus 30, electronic parts (not shown) are covered by a frame. In FIG. 18, a PC card 2, which is to be set in the small electronic apparatus 30, is also illustrated. The PC card 2 includes a connector for connecting to a connector of the small electronic apparatus 30. In FIG. 18, an opening 31 for inserting a PC card into the small electronic apparatus 30, an input device 13 by a pen, and a LCD (Liquid Crystal Display) module 14 are also illustrated.

As illustrated in FIG. 19, a leg 9 for adjusting an angle of an operator board of the small electronic apparatus 30 is provided on a base of the small electronic apparatus 30. An operating condition of the small electronic apparatus 30 can be optimized by adjusting the angle of the operator board.

In FIG. 20, a circuit substrate 15, which is one of the electronic parts included in the interior of the frame, is illustrated. A PC card connector 3 for connecting the PC card 2 is provided on the circuit substrate 15. Connector pins 4 for connecting the PC card 2 electrically and a guide 8 for securely connecting the PC card 2 to the PC card connector 3 are also illustrated.

The configuration of the small electronic apparatus, in which the PC card is set according to the related art, is explained with reference to FIGS. 18, 19 and 20.

As illustrated in FIGS. 18 and 19, the PC card 2 is inserted into the small electronic apparatus 30 through the opening 31. As illustrated in FIG. 20, the PC card 2 is moved along the guide 8 in the small electronic apparatus 30 and connected to the connector pins 4 of the PC card connector 3 on the circuit substrate 15.

Since the card is set (e.g., disposed) inside the electronic apparatus according to the related art, a space for setting the card is necessary in the electronic apparatus. This requirement is an obstacle for designing a smaller and thinner electronic apparatus.

SUMMARY OF THE INVENTION

Among other objectives, this invention is intended to solve the above-stated problem in the related art. This invention aims at designing a smaller and thinner electronic apparatus.

An electronic apparatus includes an electronic part, connectable to a card, for operating the electronic apparatus, a frame for storing the electronic part, and a connector, which can be provided outside the frame, for connecting the card and the electronic part.

An electronic apparatus includes an electronic part, connectable to a card, for operating the electronic apparatus, and a frame, which has an opening, for storing the electronic part inside the frame. The card covers the opening, when the card is connected to the electronic part.

A card setting method in an electronic apparatus, which includes an electronic part connectable to a card for operating the electronic apparatus, a frame for storing the electronic part, and a connector, which can be provided outside the frame for connecting the card and the electronic part includes steps of storing the connector inside the frame, moving the connector outside the frame, to set the card, and connecting the card to the connector outside the frame.

An electronic apparatus includes a frame which has an interior portion, an electronic part disposed within said interior portion of said frame, and a connector for electrically engaging a card, such that when engaged, said card is disposed substantially outside said interior portion of said frame.

Further features and applications of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Other objects features, and advantages of the invention will be apparent from the following description when taken in conjunction with the accompany drawings.

DESCRIPTION OF THE PREFERRED EMBODIMENTS

Embodiments of this invention are explained with reference to the drawings.

Embodiment 1.

Embodiment 1 according to this invention is explained with reference to FIGS. 1–6.

In embodiment 1, a small electronic apparatus with an input device comprising a pen and a PC card are used for illustration purposes.

Figure 1:
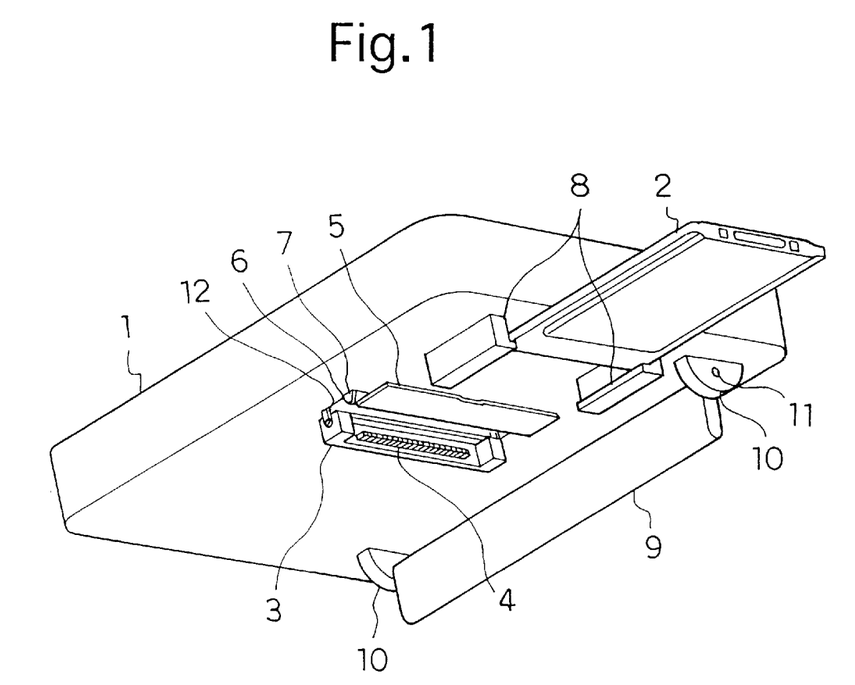
FIG. 1 illustrates a bottom perspective view of a small electronic apparatus with an input device comprising a pen according to embodiment 1 of this invention.
Figure 2:
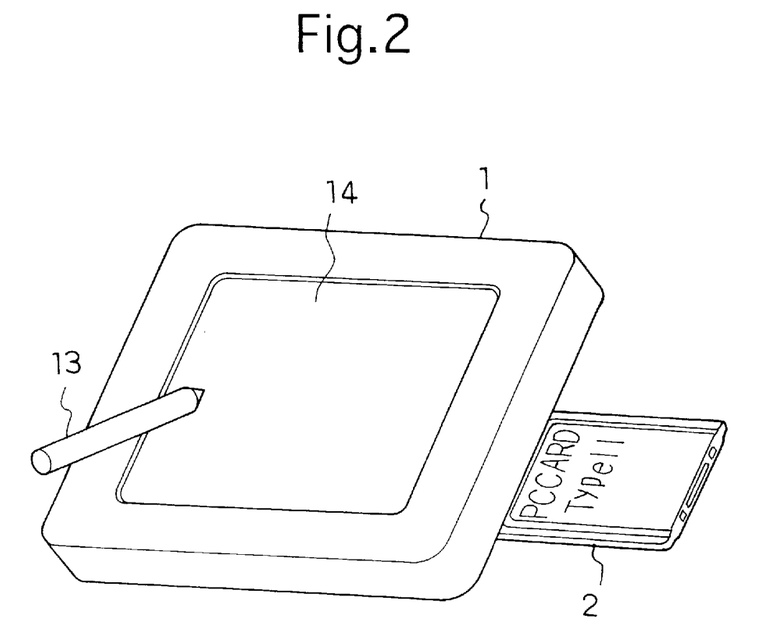
FIG. 2 illustrates a perspective view of an operator board of the small electronic apparatus with the pen input device according to embodiment 1 of this invention.

FIGS. 1 and 2 illustrate perspective views of the small electronic apparatus with the input device comprising the pen. FIG. 1 is a bottom perspective view of the small electronic apparatus. FIG. 2 is a perspective view of the small electronic apparatus showing an operator board of the small electronic apparatus.

Figure 3:
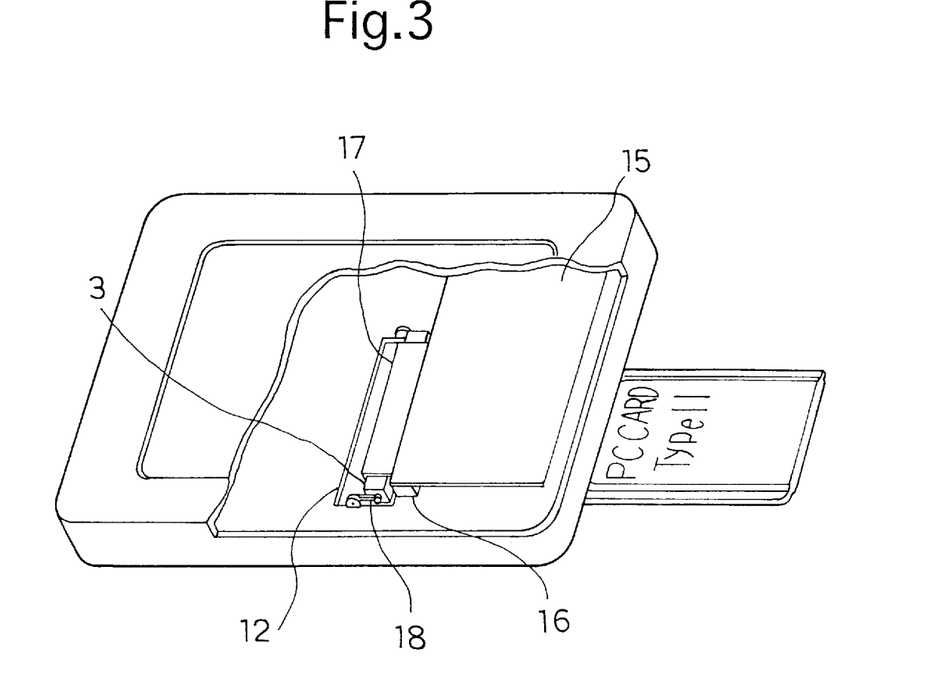
FIG. 3 illustrates a "broken" view of the small electronic apparatus according to embodiment 1 of this invention, in which a PC card connector is provided inside.

FIG. 1 illustrates a small electronic apparatus 1, in which a PC card is set in a configuration according to embodiment 1 of this invention. In the small electronic apparatus 1, electronic parts such as the circuit substrate 15 shown in FIG. 3 are covered by a frame. In FIG. 1, the PC card 2, which is to be set in (e.g., attached to) the small electronic apparatus 1, is illustrated. The PC card 2 has a connector at one of its ends. The PC card connector 3 is provided on a back side of the small electronic apparatus 1 opposed to the operator board. The PC card connector 3 is to be electrically connected to the connector of the PC card 2. The connector pins 4 are provided on the PC card connector 3 for connecting the PC card connector to the PC card 2 electrically.

In FIG. 1, when the PC card 2 is not used, an opening in the frame of the small electronic apparatus 1, through which the PC card connector 3 is moved, is closed by a lid 5. The lid 5 is attached to the small electronic apparatus 1 by holders 6 for the lid, which are provided on both sides adjacent to the opening in the frame. A hole 7 is provided in each of the holders 6 for jointing the lid 5 to the holders 6. Convex parts located at opposing edges of the lid 5 are received in and jointed to respective holes pivotally.

In FIG. 1, the guide 8 guides a movement of the PC card 2 and securely connects the PC card 2 to the connector pins 4. The leg 9 is provided on the base of the small electronic apparatus 1 for adjusting an angle of an operator board and optimizing an operation of the small electronic apparatus 1. Holders 10 for the leg are provided to attach the leg 9 to the small electronic apparatus 1, and a hole 11 is provided in each of the holders 10 for jointing the leg 9 to the holders 10. Convex parts on opposing sides of leg 9 are received in and jointed to the hole 11 pivotally. When the PC card 2 is set in the small electronic apparatus 1, the PC card connector 3 is moved through an opening 12.

In FIG. 2, the input device 13 comprising a pen and the LCD module 14 are illustrated. Of course, other types of input and display devices can be used.

The configuration of the small electronic apparatus for setting the PC card 2 according to embodiment 1 is now explained in greater detail.

When the PC card 2 is to be set in (e.g., attached to) the small electronic apparatus 1, the lid 5 on the small electronic apparatus 1 is pivoted to open the opening 12, and the PC card connector 3 is moved outside the small electronic apparatus 1. This series of actions can be performed manually (e.g., by manually putting the PC card connector outside of the frame). Alternatively, this series of actions can be performed automatically by activating a switch (not shown), for example. Then, the PC card 2 is moved along the guide 8 for the PC card and connected to the connector pins 4. Accordingly, the PC card 2 can be set outside the small electronic apparatus 1.

A movable structure of the PC card connector 3 is explained in greater detail with reference to FIGS. 3–6.

Figure 4:
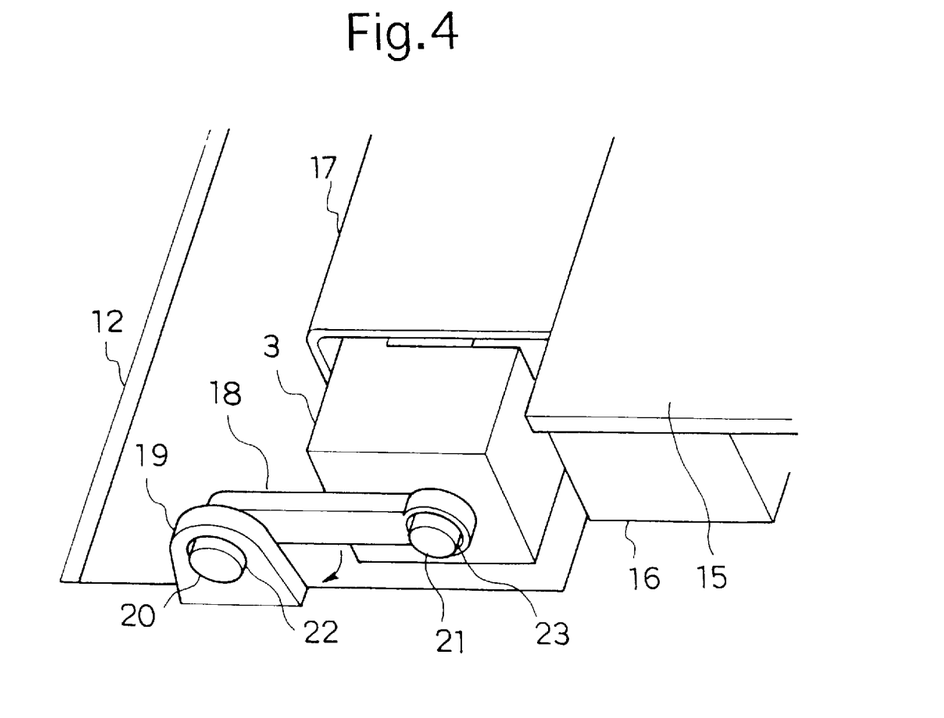
FIG. 4 illustrates a "broken" view of the small electronic apparatus according to embodiment 1 of this invention, in which the PC card connector is provided inside.
Figure 5:
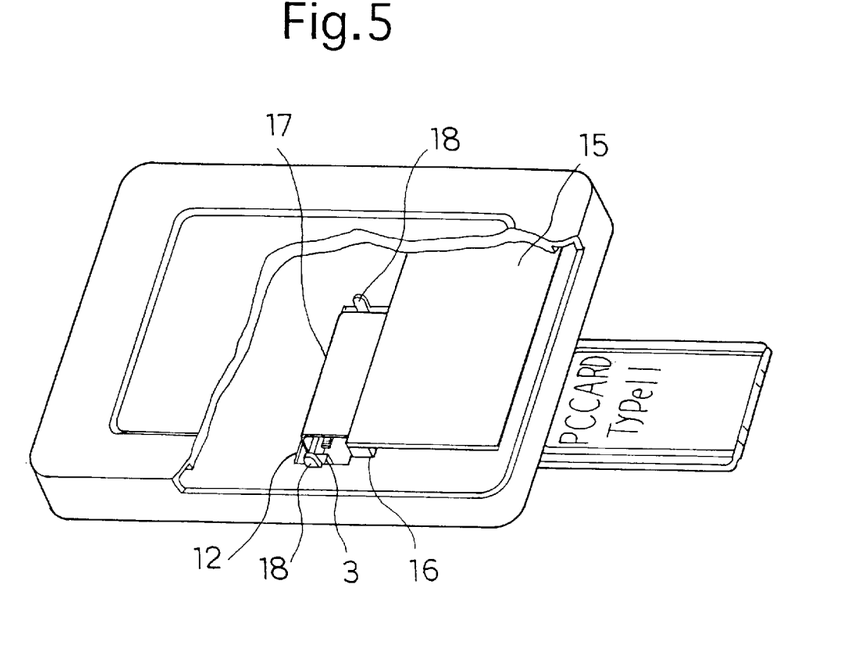
FIG. 5 illustrates a "broken" view of the small electronic apparatus according to embodiment 1 of this invention, in which the PC card connector is moved outside.

FIGS. 3–6 illustrate "broken" views of the small electronic apparatus 1 for explaining a configuration for setting the PC card in the small electronic apparatus 1. In the "broken" view illustrated in FIG. 3, the PC card connector 3 is provided inside the small electronic apparatus 1. In the "broken" view illustrated in FIG. 4, the PC card connector 3 in FIG. 3 is enlarged. In the "broken" view illustrated in FIG. 5, the PC card connector 3 is moved outside the small electronic apparatus 1. The PC card connector 3 in FIG. 5 is enlarged in the "broken" view of FIG. 6.

In FIGS. 3–6, the circuit substrate 15 is provided in the small electronic apparatus 1 as one of the electronic parts enclosed by the frame. A connector 16 is provided on the circuit substrate 15 and electrically connected to an element in the circuit substrate 15. A flexible FPC (Flat Personal Computer) cable 17 electrically connects the PC card connector 3 and the connector 16. Arms 18 for moving the PC card connector 3 inside or outside the small electronic apparatus 1 are provided. An end of each of the arms 18 is pivotally jointed to a side of the PC card connector 3, and another end of each of the arms 18 is pivotally jointed to each of the sides adjacent to the opening 12 in the frame of the small electronic apparatus 1.

Arm holders 19 for holding the arms 18 are provided at both sides adjacent to the opening 12 in the frame of the small electronic apparatus 1. A cylindrical arm shaft 20 is provided at an end of each of the arms 18, and a cylindrical connector shaft 21 is provided at each of longitudinal ends of the PC card connector 3. A hole 22 for inserting the arm shaft 20 is provided on each of the arm holders 19, and each of the arms 18 is pivotally jointed to each of the arm holders 19. A hole 23 for inserting the connector shaft 21 is provided at an end of each of the arms, and each of the arms is pivotally jointed to the PC card connector 3.

A configuration of the small electronic apparatus 1 for setting the PC card 2 is further explained with reference to FIGS. 3–6.

As illustrated in FIGS. 3 and 4, when the PC card 2 is not set in the small electronic apparatus 1, the arms 18 are pivoted on the arm shaft 20 in a reverse-clockwise direction, and the PC card connector 3 is stored in the small electronic apparatus 1 in almost a parallel orientation with respect to the bottom of the frame of the small electronic apparatus 1. The opening 12 is closed or substantially closed by the lid 5.

Figure 6:
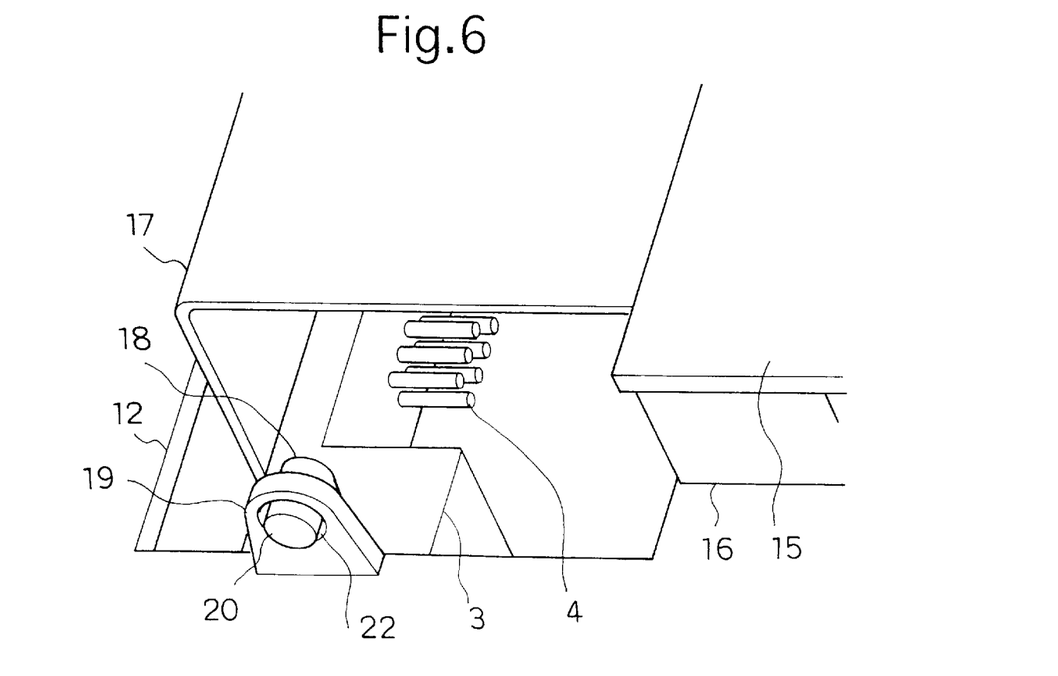
FIG. 6 illustrates a "broken" enlarged view of the small electronic apparatus according to embodiment 1 of this invention, in which the PC card connector is moved outside.

As illustrated in FIGS. 5 and 6, when the PC card 2 is to be set in the small electronic apparatus 1, the arms 18 are pivoted on the arm shaft 20 clockwise by approximately 90 degrees from a stored position, and the PC card connector 3 is moved outside the small electronic apparatus 1. Other angles of rotation are also possible.

As stated, the electronic apparatus according to embodiment 1 includes the frame for storing the electronic parts and the connector. The connector can be moved outside the frame, for connecting the card and the electronic parts. Therefore, a space for storing the card is not necessary inside the small electronic apparatus 1, and down-sizing and reduction in the thickness of the small electronic apparatus is realized.

Since the PC card can be set outside the small electronic apparatus, the PC card can be used even in an electronic apparatus of A6 size, which generally does not have enough space for the PC card within its frame.

When the card is connected to the electronic apparatus, the connector is moved outside the frame. When the card is not connected to the electronic apparatus, the connector is moved inside the frame. Therefore, when the connector is not used, the connector is protected from damage, while down-sizing and reducing the thickness of the electronic apparatus.

Further, since there is an opening in the frame through which the connector is moved inside or outside the frame and the connector pivots through the opening, the connector can be easily moved inside or outside the frame.

In Embodiment 1, the connector is moved inside or outside the frame. However, the connector may also be fixed outside the frame.

Those skilled in the art will also recognize that the connector 3 can be moved out of the frame using different mechanisms (other than the pivoting arm arrangement). For instance, the connector 3 can be slid laterally out of the frame. Also, the connector 3 can be directly pivotally attached to the frame body (i.e., without the use of the arms). Embodiment 2.

Embodiment 2 according to this invention is explained with reference to FIGS. 7 and 8.

Figure 7:
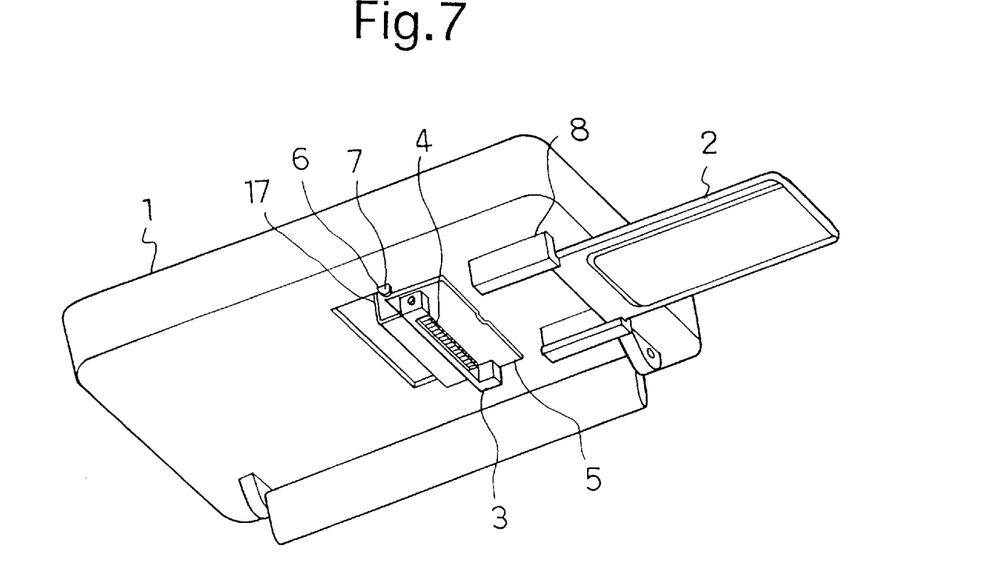
FIG. 7 illustrates a perspective view of a small electronic apparatus according to embodiment 2 of this invention, in which a PC card connector is moved outside.

FIG. 7 illustrates a perspective view of the small electronic apparatus 1, in which the PC card connector 3 is set outside. FIG. 8 illustrates a "broken" view of the small electronic apparatus in which the PC card connector 3 is set inside.

In embodiment 1, the PC card connector 3 is moved inside or outside the small electronic apparatus 1 by using the arms. However, in embodiment 2, the PC card connector 3 is attached to the lie 5 for the PC card connector 3. The PC card connector 3 can be moved inside the small electronic apparatus 1 by closing the lid 5, and the PC card connector 3 can be moved outside the small electronic apparatus by opening the lid 5. Again, the lid can be opened manually or automatically.

Figure 8:
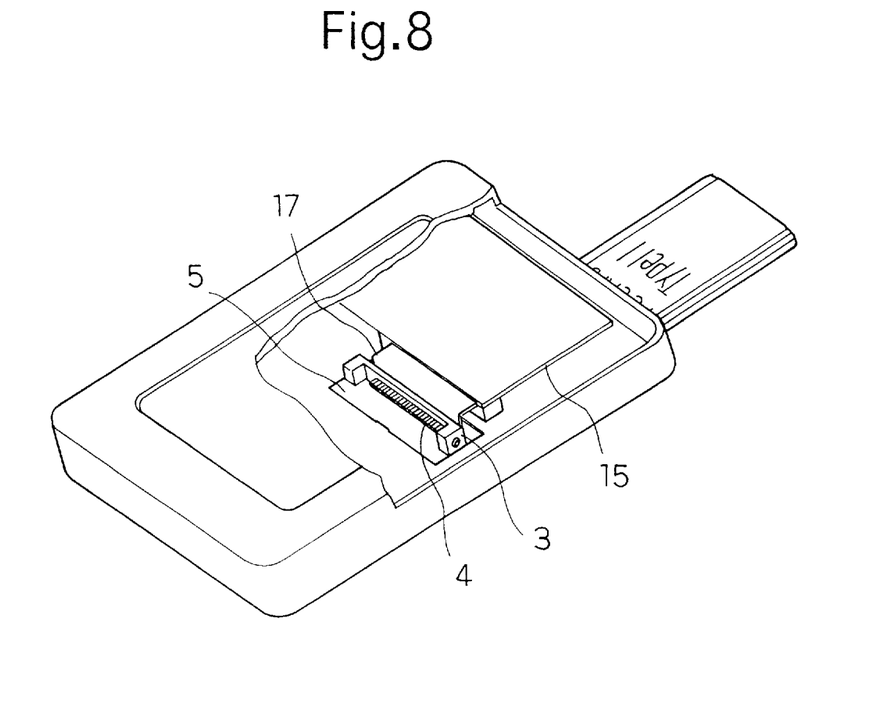
FIG. 8 illustrates a "broken" view of the small electronic apparatus according to embodiment 2 of this invention, in which the PC card connector is provided inside.

In FIGS. 7 and 8, the same signs are used to designate the same or corresponding elements in FIGS. 1–6, and explanations or those elements are omitted in embodiment 2.

In embodiment 2, the PC card connector 3 is attached to the aid 5 for the PC card connector, which is jointed to the bottom of the small electronic apparatus 1. Hence, the lid 5 and the PC card connector 3 move together. When the lid 5 pivots on the hole 7 in the holder 6 for jointing the lid 5 and opens, the PC card connector 3 moves outside the small electronic apparatus 1. Further, since the PC card connector 3 is connected to the connector 16 on the circuit substrate 15 by the FPC cable 17, even when the PC card connector 3 moves outside the small electronic apparatus 1, the PC card connector 3 and the connector 16 are connected electrically.

When the lid 5 pivots to close the opening, the PC card connector 3 can be moved inside the small electronic apparatus 1. This is the reverse to the procedure in which the PC card connector 3 is moved outside the small electronic apparatus.

In summary, the small electronic apparatus according to embodiment 2 includes an opening in the frame for storing the connector and a lid for closing the opening. The connector is provided on the lid. When the lid is opened, the connector is moved outside the small electronic apparatus. When the lid is closed, the connector is moved inside the small electronic apparatus. Since the connector moves together with the lid, an operation condition (e.g., the ease of operation) is improved.

Embodiment 3.

Embodiment 3 according to this invention is explained with reference to FIGS. 9–12.

Figure 9:
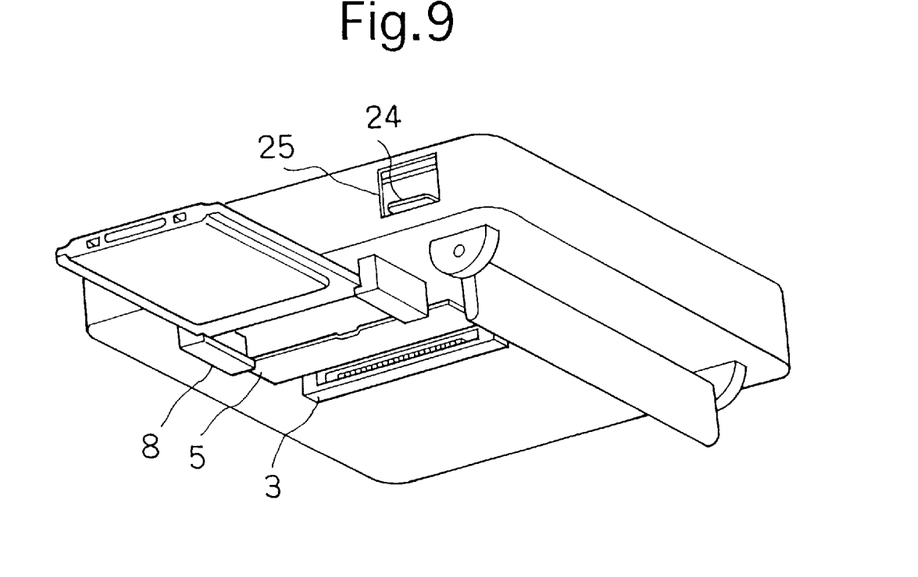
FIG. 9 illustrates a perspective view of a small electronic apparatus according to embodiment 3 of this invention, in which a PC card connector is moved outside.
Figure 10:
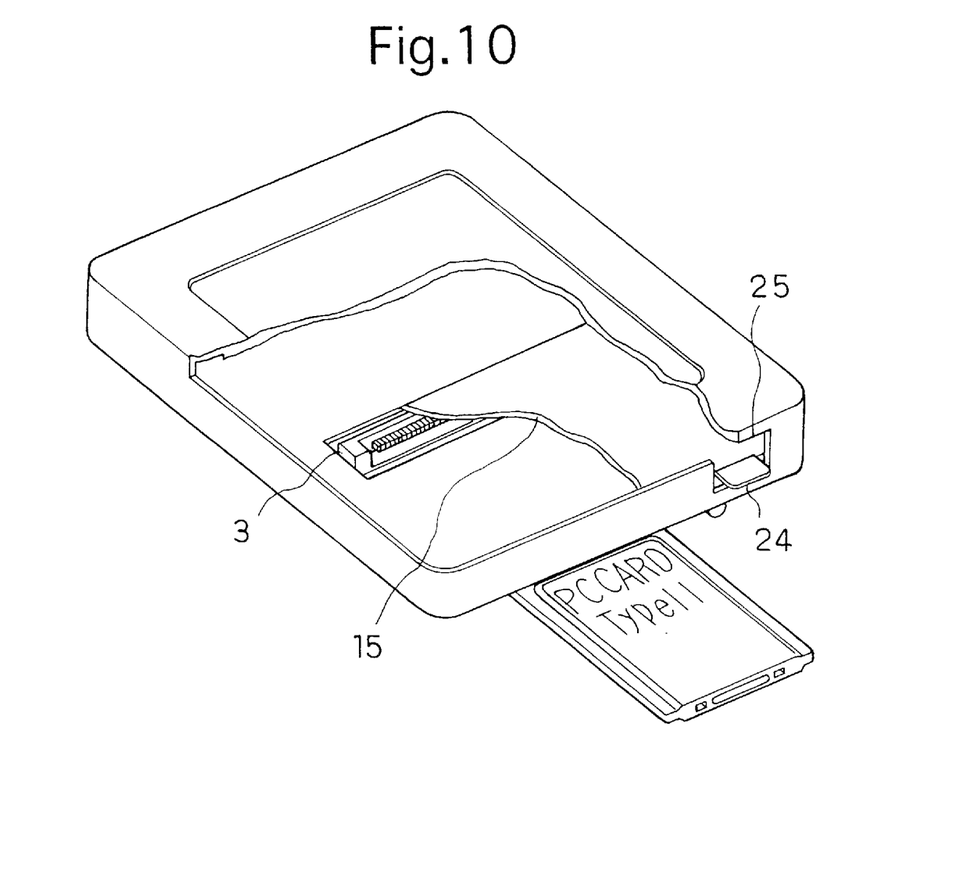
FIG. 10 illustrates a "broken" view of the small electronic apparatus according to embodiment 3 of this invention, in which the PC card connector is moved outside.
Figure 11:
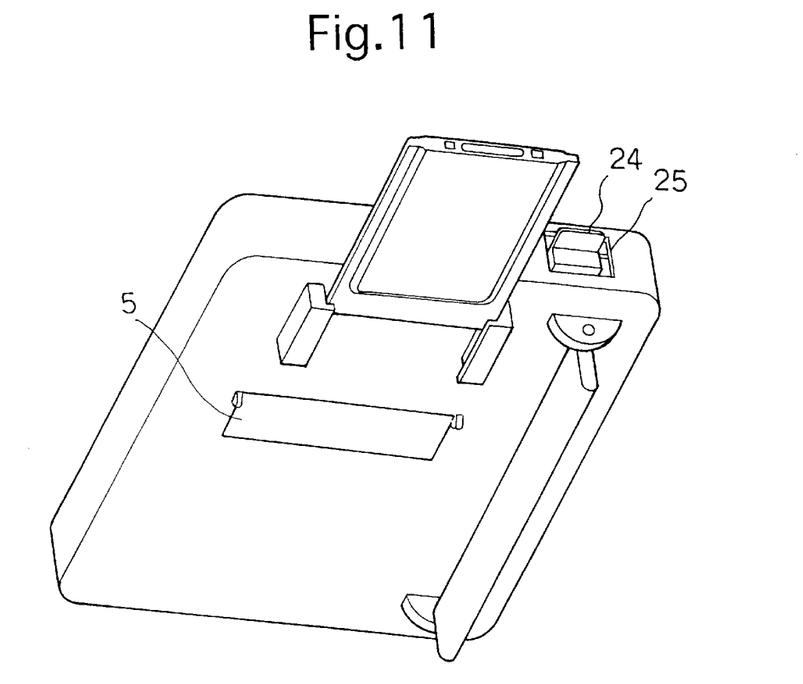
FIG. 11 illustrates a perspective view of the small electronic apparatus according to embodiment 3 of this invention, in which the PC card connector is provided inside.
Figure 12:
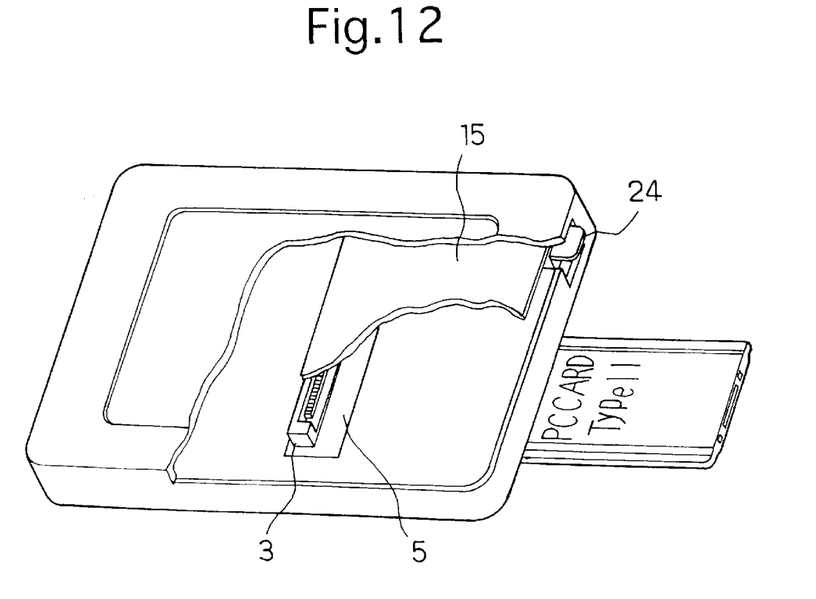
FIG. 12 illustrates a "broken" view of the small electronic apparatus according to embodiment 3 of this invention, in which the PC card connector is provided inside.

FIG. 9 illustrates a perspective view of the small electronic apparatus 1, in which the PC card connector 3 is moved outside. FIG. 10 illustrates a "broken" view of the small electronic apparatus 1, in which the PC card connector 3 is moved outside. FIG. 11 illustrates a perspective view of the small electronic apparatus 1, in which the PC card connector 3 is set inside. FIG. 12 illustrates a "broken" view of the small electronic apparatus 1, in which the PC card connector 3 is set inside.

In embodiment 3, the PC card connector 3 is provided on the circuit substrate 15. Therefore, the PC card connector 3 can be moved outside the small electronic apparatus 1 by moving the circuit substrate 15 in the small electronic apparatus 1.

In FIGS. 9–12, the same signs are used to denote the same or corresponding elements in FIGS. 1–8, and explanations for those like elements are omitted in embodiment 3.

In FIGS. 9–12, a lever 24 for moving the circuit substrate 15 is provided on the circuit substrate 15 in the small electronic apparatus 1. An opening 25 is provided on a side of the small electronic apparatus 1. The lever 24 for moving the circuit substrate 15 sticks out from the opening 25, and the lever 24 can be operated from outside the small electronic apparatus 1. Further, since the PC card connector 3 is directly provided on the circuit substrate 15, the connector 16, FPC cable 7, arms 18, arm holders 19, etc., which are provided in embodiments 1 and 2, are not provided in embodiment 3.

When the PC card 2 is set in the small electronic apparatus 1, the lever 24 for moving the circuit substrate is moved down to a direction of the bottom of the small electronic apparatus 1 along the opening 25. Accordingly, the circuit substrate 15 is moved in the direction of the bottom of the small electronic apparatus 1, and the PC card connector 3 on the circuit substrate 15 is moved outside the small electronic apparatus 1.

When the lever 24 for moving the circuit substrate is moved in a direction of the operator board through a reverse procedure with moving the PC card connector 3 outside, the circuit substrate 15 is moved to the direction of the operator board. Accordingly, the PC card connector 3 is moved inside the small electronic apparatus 1.

In summary, the electronic apparatus according to embodiment 3 includes an opening in the frame for storing the connector and a mechanism for moving an electronic part. The connector is provided on the electronic part, and the connector is moved outside or inside the small electronic apparatus by moving the electronic part. Accordingly, the connector can be moved inside or outside the frame using a simple configuration.

Embodiment 4.

Embodiment 4 according to this invention is explained with reference to FIG. 13.

Figure 13:
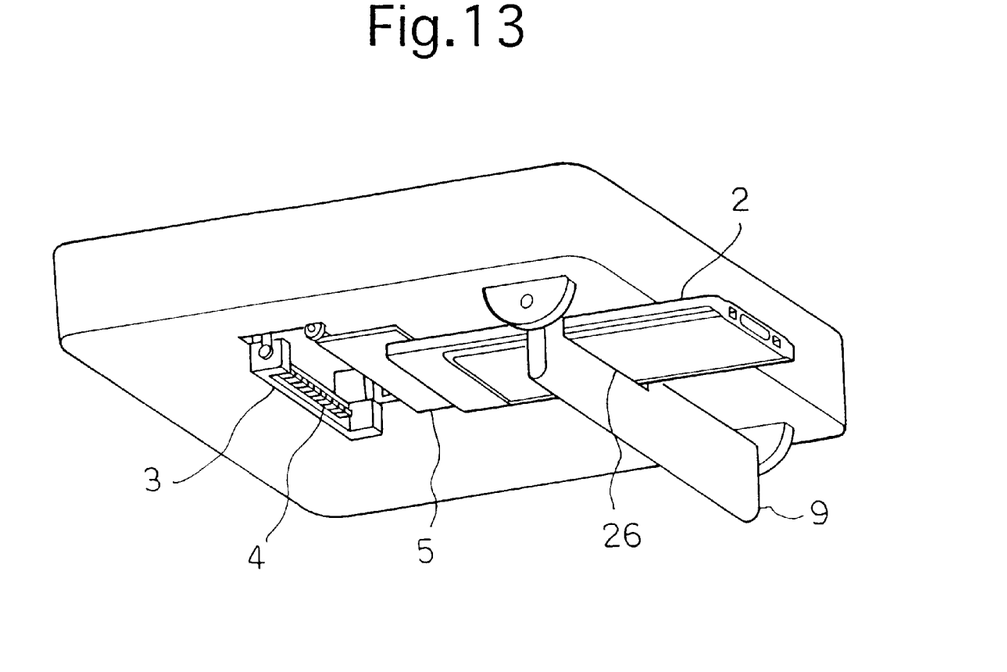
FIG. 13 illustrates a bottom perspective view of a small electronic apparatus according to embodiment 4 of this invention, in which a PC card connector is moved outside.

FIG. 13 illustrates a bottom perspective view of the small electronic apparatus 1, in which the PC card connector 3 is moved outside.

In embodiment 4, a guide for the PC card is provided in the leg 9 of the small electronic apparatus 1.

In FIG. 13, the same signs are used to designate the same or corresponding elements in FIGS. 1–12, and explanations for those elements are omitted in embodiment 4.

In embodiments 1–3, the guide is provided on the base of the small electronic apparatus. In these embodiments, the guide is separated from the leg 9. However, in embodiment 4, a part of the leg 9 is cut to approximate the width of the PC card, and the leg 9 functions as a guide 26 for the PC card 2.

Therefore, the leg 9 is jointed to the base of the small electronic apparatus 1 so that a longitudinal side of the leg 9 is approximately vertical (e.g., perpendicular) with a direction for inserting the PC card 2 to the connector through the guide 26.

When the leg 9 is moved approximately vertically with respect to the base of the small electronic apparatus 1, the PC card 2 can be inserted into the guide 26 in the leg 9, and connected to the PC card connector 3. Therefore, it is unnecessary to provide a guide on the base of the small electronic apparatus 1.

In summary, the electronic apparatus according to embodiment 4 includes a mechanism for guiding movement of the card and changing an angle of the operator board of the electronic apparatus, which is provided outside the frame of the electronic apparatus. Therefore, a number of parts can be reduced, and a simple configuration can be realized.

In embodiment 4, the PC card connector 3 is moved inside or outside as in embodiment 1. However, the PC card connector 3 can be also moved using the disclosed mechanisms of embodiments 2 and 3.

Embodiment 5.

Embodiment 5 according to this invention is explained with reference to FIG. 14.

Figure 14:
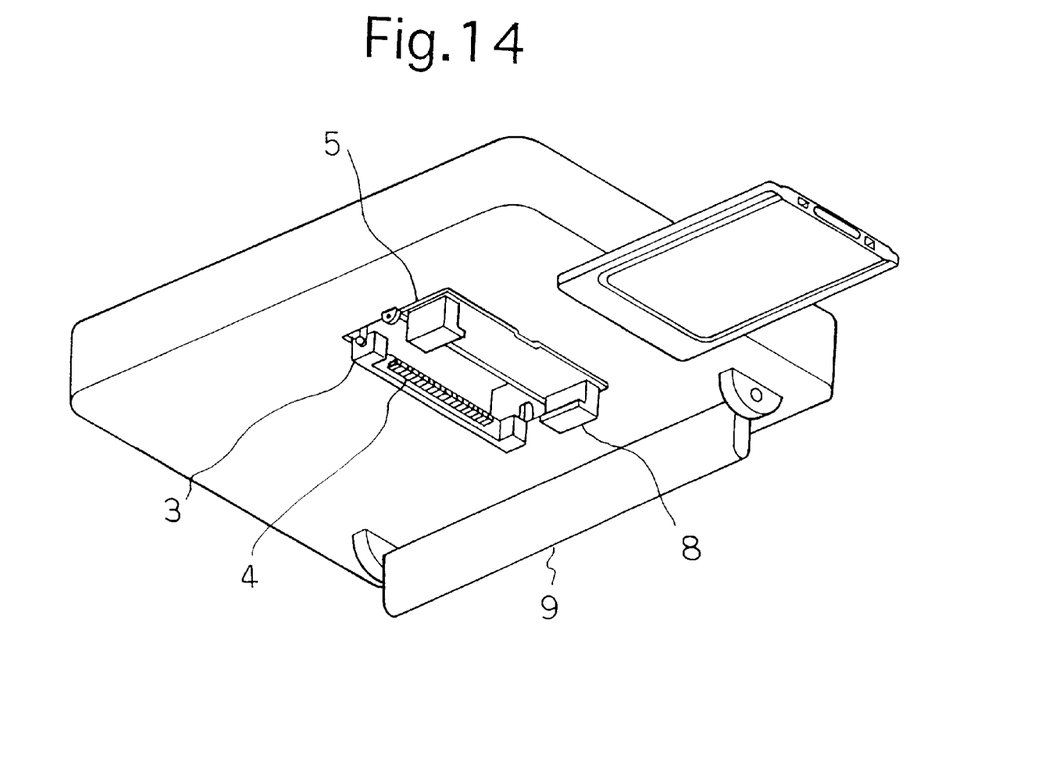
FIG. 14 illustrates a bottom perspective view of a small electronic apparatus according to embodiment 5 of this invention, in which a PC card connector is provided outside.

FIG. 14 illustrates a bottom perspective view of the small electronic apparatus 1, in which the PC card connector 3 is moved outside. In embodiment 5, a guide for the PC card is provided on the lid for the PC card connector in the small electronic apparatus 1.

In FIG. 14, the same signs are used to designate the same or corresponding elements in FIGS. 1–13, and explanations for those elements are omitted in embodiment 5.

As illustrated in FIG. 14, the guide 8 for guiding movement of the PC card 2 is provided on the lid 5. When the lid 5 is opened by pivoting, the guide 8 guides the PC card 2 to the PC card connector 3.

When the PC card 2 is to be set in the small electronic apparatus 1, the lid 5 for closing the opening 12 is opened by pivoting the lid 5. Then, the guide 8, which is provided on the lid 5, appears on the base of the small electronic apparatus 1.

When the PC card 2 is not set in the small electronic apparatus 1, the lid pivots to close the opening 12. Simultaneously, the guide 8 is stored in the frame of the small electronic apparatus 1.

In summary, the electronic apparatus according to embodiment 5 includes an opening in the frame, a lid for closing the opening, and a mechanism provided on the lid for guiding the movement of the card, when the lid is open. In embodiment 5, the guide is outside the frame only when the PC card is used. Therefore, when the PC card is not used, down-sizing and reducing the thickness of the electronic apparatus can be realized.

Embodiment 6.

Embodiment 6 according to this invention is explained with reference to FIGS. 15–17.

Figure 15:
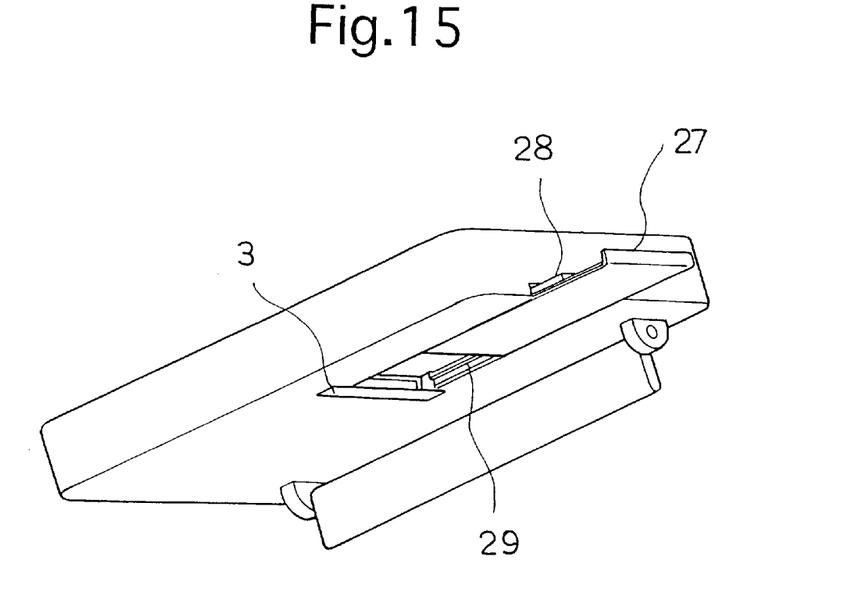
FIG. 15 illustrates a bottom perspective view of the small electronic apparatus according to embodiment 5 of this invention for explaining setting of a lid, which constitutes a part of a frame of the small electronic apparatus, when the PC card is not set.

FIG. 15 illustrates a bottom perspective view of the small electronic apparatus 1, in which the PC card is not set, for explaining a structure of a lid which is a part of the frame of the small electronic apparatus 1. FIG. 16 illustrates a bottom perspective view of the small electronic apparatus 1, in which the PC card is to be set, for explaining setting of the PC card in the small electronic apparatus 1. FIG. 17 illustrates a "broken" view of the small electronic apparatus 1, in which the PC card is to be set, for explaining an internal configuration of the small electronic apparatus 1.

In Embodiment 6, when the PC card is set in the small electronic apparatus, the PC card becomes a part of the frame of the small electronic apparatus 1.

Figure 16:
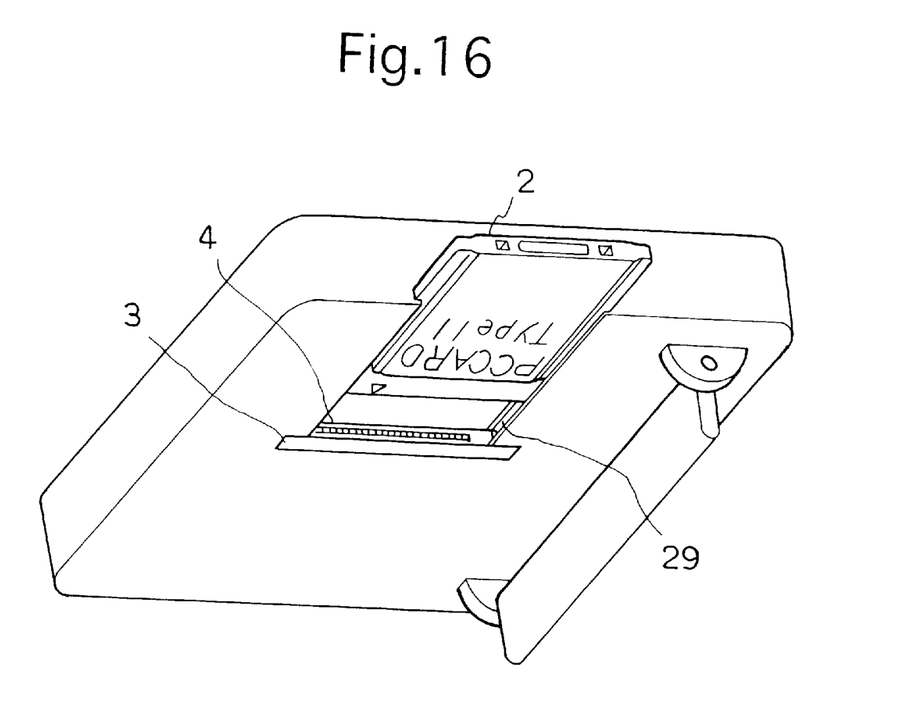
FIG. 16 illustrates a bottom perspective view of the small electronic apparatus according to embodiment 5 of this invention for explaining setting of the PC card, when the PC card is set.
Figure 17:
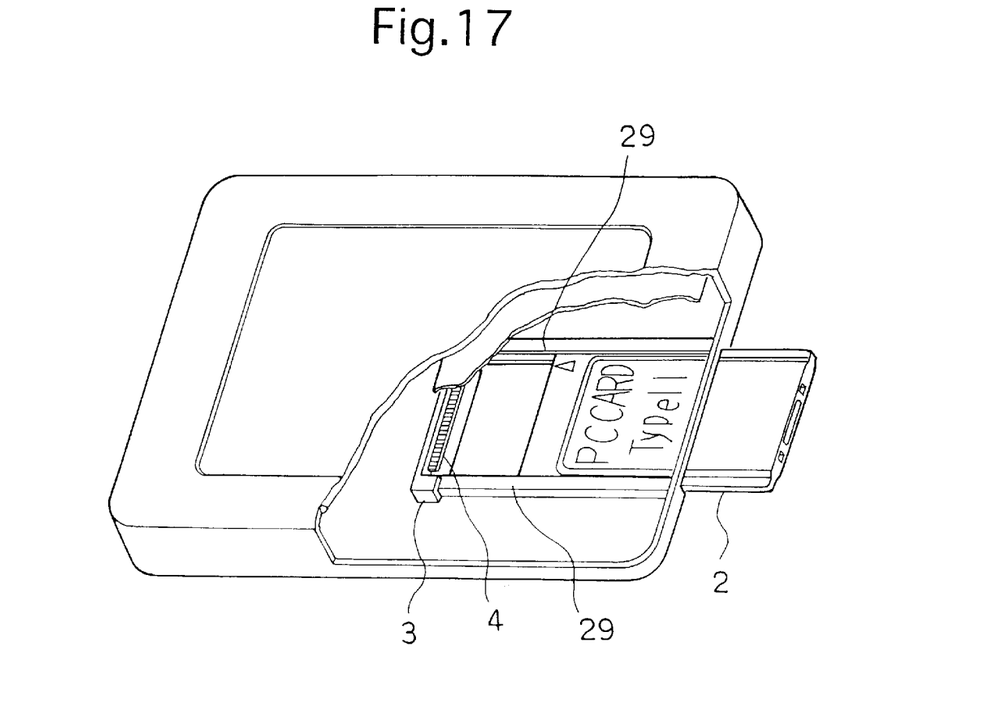
FIG. 17 illustrates a "broken" view of the small electronic apparatus according to embodiment 5 of this invention for explaining an internal configuration of the small electronic apparatus, when the PC card is set.

In FIGS. 15–17, the same signs are used to designate the same or corresponding elements in FIGS. 1–14, and explanations for those elements are omitted in embodiment 6.

In FIGS. 15–17, a lid 27, which is a part of the frame of the small electronic apparatus 1, and a convex part 28 on the lid 27 for setting the lid 27 in the small electronic apparatus 1 are illustrated. When the lid 27 is set in the small electronic apparatus 1, the lid 27 closes an opening on a side of the small electronic apparatus 1. A guide 29 for setting the lid 27 in the small electronic apparatus 1 is also illustrated. Each side of the lid 27 fits into the guide 29, and the lid 27 can slide and be extracted from a side of the small electronic apparatus.

As illustrated in FIG. 15, when the PC card 2 is not used, the lid 27 is set in the small electronic apparatus 1 and constitutes a part of the frame of the small electronic apparatus 1. The convex part 28 on the lid 27 is inserted in engagement with the guide 29 on the small electronic apparatus 1, and the lid 27 is set in the small electronic apparatus 1.

As illustrated in FIGS. 16 and 17, when the PC card is used, the lid 27 is removed and set aside, and the PC card 2 is inserted into the guide 29 in the small electronic apparatus 1 for connecting to the connector pins 4 on the PC card connector 3.

In summary, the electronic apparatus according to embodiment 6 includes an electronic part to which a card is connected for operating, and a frame which has an opening for storing the electronic part in the electronic apparatus. Since the opening is closed by the card, when the card is connected to the electronic part, a space for setting the card is not necessary in the electronic apparatus. Hence, downsizing and reducing the thickness of the electronic apparatus is realized.

Especially for a small electronic apparatus of an A6 size which generally does not have a space for the PC card inside the small electronic apparatus, since the PC card can be set outside the small electronic apparatus (or as part of the frame), the PC card can be used.

In embodiments 1–6, the PC card is used for an explanation purpose. However, any type of card medium, e.g., IC card, etc., which can be set in the electronic apparatus, can be used.

In embodiment 1–6, the small electronic apparatus with an input device comprises a pen used for explanation purposes. However, a small electronic apparatus with any type of input device, e.g., keyboard, mouse, etc. can be used. Further, a communication terminal and a data terminal may also be used. Further, any size of electronic apparatus may be used.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An electronic apparatus comprising:

an electronic part, connectable to a card, for operating the electronic apparatus;

a frame for storing the electronic part; and a connector, which can be provided outside the frame, for connecting the card and the electronic part;

wherein the connector is moved outside the frame when the card is connected to the electronic part, and the connector is moved inside the frame when the card is not connected to the electronic part;

wherein the frame comprises an opening for storing the connector and a mechanism for moving the electronic part, wherein the connector, provided on the electronic part, is moved inside or outside the electronic apparatus when the electronic part is moved by the mechanism.

2. The electronic apparatus according to claim 1, wherein said electronic part is a circuit substrate.

3. The electronic apparatus according to claim 1, wherein said mechanism for moving the electronic part comprises a lever provided on the electronic part, wherein said lever protrudes from an opening in said frame.

4. An electronic apparatus comprising:

an electronic part, connectable to a card, for operating the electronic apparatus;

a frame for storing the electronic part; and a connector, which can be provided outside the frame, for connecting the card and the electronic part;

wherein the frame comprises an opening, a lid for closing the opening, and a guiding mechanism for guiding in and out movement of the card, when the lid on the frame is open;

wherein the frame comprises a leg for changing an operating angle of the electronic apparatus, wherein the guiding mechanism is provided in the leg.

5. The electronic apparatus according to claim 4, wherein said guiding mechanism comprises a slot formed in said leg.

6. An electronic apparatus comprising:

an electronic part, connectable to a card, for operating the electronic apparatus; and a frame, which has an opening, for storing the electronic part inside the frame, wherein the card covers the opening, when the card is connected to the electronic part;

further comprising:

a lid for covering the opening; and a guiding mechanism for guiding setting of the lid and the card.

7. The electronic apparatus according to claim 6, wherein said guiding mechanism is formed at an edge of said opening.

8. The electronic apparatus according to claim 6, wherein, when said card is engaged in said opening, an outer surface of said card lies substantially flush with an outer surface of said frame.

9. The electronic apparatus according to claim 6, wherein said card substantially seals said opening when engaged with said opening.

10. An electronic apparatus comprising:

a frame having an interior portion;

an electronic part disposed within said interior portion of said frame; and a connector for electrically engaging a card, such that when engaged, said card is disposed substantially outside said interior portion of said frame with said connector;

further comprising an opening formed in said frame;

wherein said connector is mounted to said electronic part, and further including means for moving said electronic part toward said opening so as to advance said attached connector through said opening for engagement with said card.

11. The electronic apparatus according to claim 10, wherein said electronic part is a circuit substrate.

12. The electronic apparatus according to claim 10, wherein said means for moving the electronic part comprises a lever provided on the electronic part, wherein said lever protrudes from an opening in said frame.

13. An electronic apparatus comprising:

a frame having an interior portion;

an electronic part disposed within said interior portion of said frame; and a connector for electrically engaging a card, such that when engaged, said card is disposed substantially outside said interior portion of said frame with said connector;

wherein said frame includes a leg attached thereto, and said leg includes a slot formed therein through which said card can be inserted, said slot forming a guide member for guiding said card into engagement with said connector.

14. The electronic apparatus according to claim 13, wherein said guiding mechanism comprises a rectangular slot formed in said leg.

15. An electronic apparatus comprising:

a frame having an interior portion;

an electronic part disposed within said interior portion of said frame; and a connector for electrically engaging a card, such that when engaged, said card is disposed substantially outside said interior portion of said frame with said connector;

further comprising an opening formed in said frame;

wherein said opening forms a concave slot in a wall of said frame, and when said connector engages said card, said card substantially blocks said opening, wherein an edge of said slot serves as a guiding member for guiding said card.

16. The electronic apparatus according to claim 15, wherein, when said card is engaged in said opening, an outer surface of said card lies substantially flush with an outer surface of said frame.

17. The electronic apparatus according to claim 15, wherein said concave slot is formed by a substantially U-shaped slot, wherein a first edge of said U-shaped slot forms said guiding member, and a second edge of said U-shaped slot contains said connector.

18. An electronic apparatus comprising:

a frame having an interior portion;

an electronic part disposed within said interior portion of said frame;

a connector for electrically engaging a card, such that when engaged, said card is disposed substantially outside said interior portion of said frame with said connector;

an opening formed in said frame;

a pivoting lid for blocking said opening;

wherein said connector can be moved from within said interior portion to outside of said interior portion of said frame when said lid is moved from a closed position to an open position, respectively;

wherein said lid and said connector are separately movable.

19. The electronic apparatus according to claim 18, further including a guide member for guiding said card into engagement with said connector, wherein said guide member is attached to said lid.

20. An electronic apparatus comprising:

a frame having an interior portion;

an electronic part disposed within said interior portion of said frame;

a connector for electrically engaging a card, such that when engaged, said card is disposed substantially outside said interior portion of said frame with said connector;

an opening formed in said frame;

a pivoting lid for blocking said opening;

wherein said connector can be moved from within said interior portion to outside of said interior portion of said frame when said lid is moved from a closed position to an open position, respectively;

wherein said lid pivots about an angle of 180° between the closed and open positions.

* * * * *